United States Patent [19]
Park

[11] Patent Number: 5,347,240
[45] Date of Patent: Sep. 13, 1994

[54] CIRCUIT AND METHOD FOR AUTOMATICALLY CONTROLLING THE CARRIER FREQUENCY OF A VIDEO RECORDING DEVICE

[75] Inventor: Eui-Keun Park, Seoul, Rep. of Korea

[73] Assignee: SamSung Electronics Co., Ltd., Suwon, Rep. of Korea

[21] Appl. No.: 934,217

[22] Filed: Aug. 25, 1992

[30] Foreign Application Priority Data

Apr. 3, 1992 [KR] Rep. of Korea .................. 1992-5552

[51] Int. Cl.⁵ .......................... H03C 3/09; H03L 1/00; H03L 7/00; H03L 7/06
[52] U.S. Cl. ....................................... 332/127; 360/30; 331/2
[58] Field of Search ....................... 332/127; 331/2, 17, 331/20, 23; 360/27, 28, 30, 33.1, 37.1

[56] References Cited

U.S. PATENT DOCUMENTS

| | | | |
|---|---|---|---|
| 4,567,448 | 1/1986 | Ikeda ................................... | 331/2 X |
| 4,686,584 | 8/1987 | Kojima et al. ................... | 360/37.1 X |
| 4,749,961 | 6/1988 | Kato et al. .................. | 331/177 R X |
| 5,043,677 | 8/1991 | Tomasetti et al. ...................... | 331/2 |
| 5,075,639 | 12/1991 | Taya ............................. | 331/177 R X |
| 5,138,282 | 8/1992 | Bailey et al. ............................. | 331/2 |
| 5,157,359 | 10/1992 | Nogami et al. .................. | 332/127 X |

*Primary Examiner*—David Mis
*Attorney, Agent, or Firm*—Robert E. Bushnell

[57] ABSTRACT

A circuit for automatically controlling a carrier frequency of a video tape recorder includes a voltage controlled oscillator, a phase detector for generating an error signal representing a phase difference between an output signal of the voltage controlled oscillator and a reference signal, an integrating circuit for converting the error signal into an error voltage, and a frequency modulator with the same structure and characteristics as the voltage controlled oscillator for generating a carrier signal having a carrier frequency equal to a frequency of the reference signal in response to both the error voltage and a voltage level of a luminance component of a video signal voltage controlled oscillator changes the oscillation frequency to have the same value as the frequency of the reference signal in response to the error voltage.

20 Claims, 2 Drawing Sheets

CIRCUIT AND METHOD FOR AUTOMATICALLY CONTROLLING THE CARRIER FREQUENCY OF A VIDEO RECORDING DEVICE

BACKGROUND OF THE INVENTION

The present invention relates to a video tape recorder, and more particularly to a circuit for automatically controlling the carrier frequency of the video tape recorder.

The video tape recorder generally converts the luminance signals into FM (frequency modulation) signals which are recorded on a tape. The video tape recorder employs an external variable resistor to correctly modulate the luminance signals into a carrier frequency of 3.4 MHZ for a sync tip level of the luminance signals. The external variable resistor is adjusted to control the carrier frequency to compensate for the characteristic changes of the frequency modulator.

On the other hand, a conventional PLL (Phase Locked Loop) compares a free oscillation frequency of a voltage controlled oscillator (VCO) with a frequency of a reference signal applied to a phase detector to produce an error signal that is changed into an error voltage through an integrating circuit such as a low pass filter (LPF). The error voltage is fed back to the VCO to generate a same frequency as a frequency of the reference signal.

The conventional PLL is limited in causing the voltage controlled oscillator to only generate the same frequency as that of the reference signal applied to the phase detector, and therefore only a single frequency can be controlled. Moreover it is difficult to manually adjust the carrier frequency without error, and the external variable resistor results in voltage loss.

SUMMARY OF THE INVENTION

It is an object of the present invention to provide a frequency modulator for automatically controlling the carrier frequency to modulate luminance signals of auideo signal into frequency modulating signals for changes of a level of the luminance signals in a video tape recorder.

It is another object of the present invention to provide a frequency modulator to minimize losses caused by manually adjusting the carrier frequency when manufacturing a video tape recorder.

According to the present invention, a frequency modulator employs a phase locked loop comprising a phase detector, low-pass filter, and voltage controlled oscillator to produce an error signal that is used for automatically controlling the frequency modulated carrier frequency for processing the video tape recorder luminance signals.

BRIEF DESCRIPTION OF THE ATTACHED DRAWINGS

For a better understanding of the invention, and to show how the same may be carried into effect, reference will now be made, by way of example, to the accompanying diagrammatic drawings, in which.

DETAILED DESCRIPTION OF A PREFERRED EMBODIMENT

Figure 1:
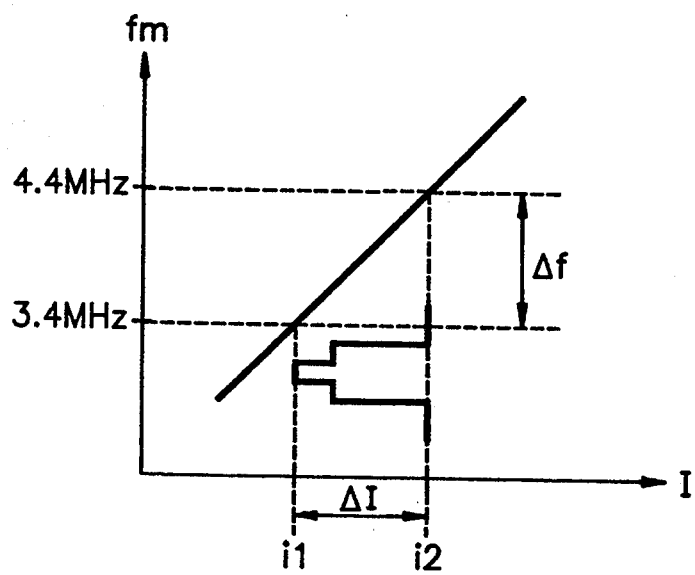
FIG. 1 is a graph showing a current versus modulating frequency relationship for luminance signals.

Referring to FIG. 1, a sync tip level and 100% white level of the luminance signals are respectively modulated with 3.4 MHZ and 4.4 MHZ in a NTSC, i.e., National Television System Committee, system. In this case, a carrier frequency that is a modulating frequency for the sync tip level should be 3.4 MHZ, and the luminance signals are modulated according to voltage levels to obtain a desired frequency modulating (FM) signal. Oscillation characteristics of a voltage controlled oscillator 30 according to the present invention are as follows:

$$f_{vco} = \frac{I}{4 \cdot C \cdot V} \tag{1}$$

Equation (1) represents the oscillation characteristics of a mono-stable oscillator, where an the oscillation frequency $f_{vco}$ is determined by a value of a capacitor C fixed according to a predetermined product characteristic, a voltage level variation V of oscillation signals and current I. In this case, the current I may be adjusted to obtain the desired frequency modulating signal, i.e., the carrier frequency $f_m$.

Figure 2:
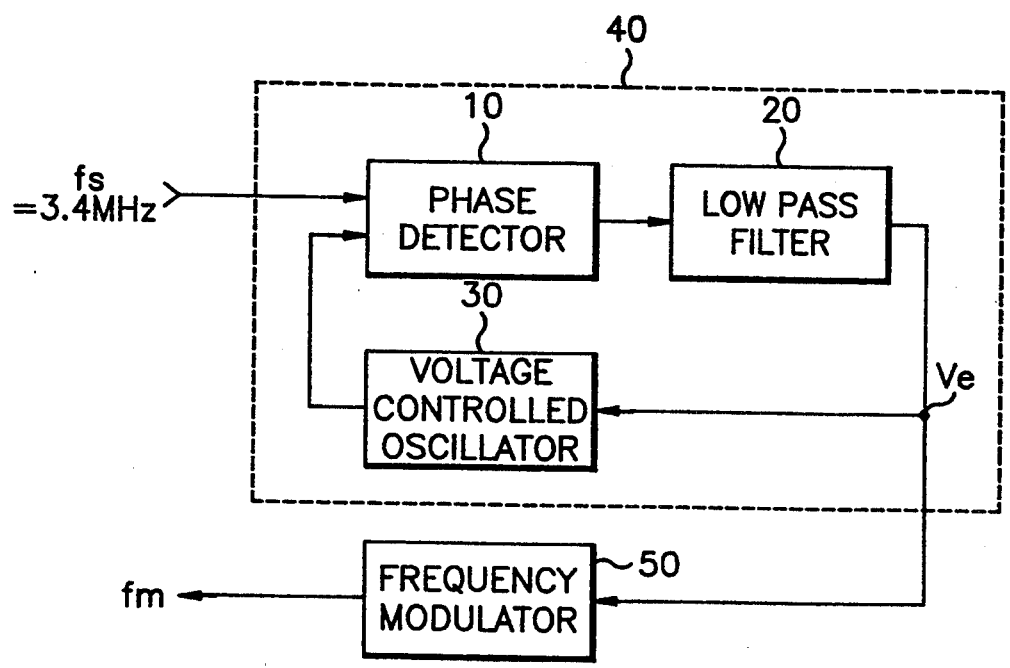
FIG. 2 is a block diagram of a circuit according to an embodiment of the present invention.

In FIG. 2, frequency modulator 50 is made to have the same structure and characteristics as the voltage controlled oscillator 30 of the phase locked loop 40. Error voltage Ve generated from the PLL 40 is applied to the voltage controlled oscillator 30 to generate the oscillation frequency $f_{vco}$ at reference frequency $f_s$=3.4 MHZ and to obtain the desired carrier frequency $f_m$ from frequency modulator 50.

Figure 3:
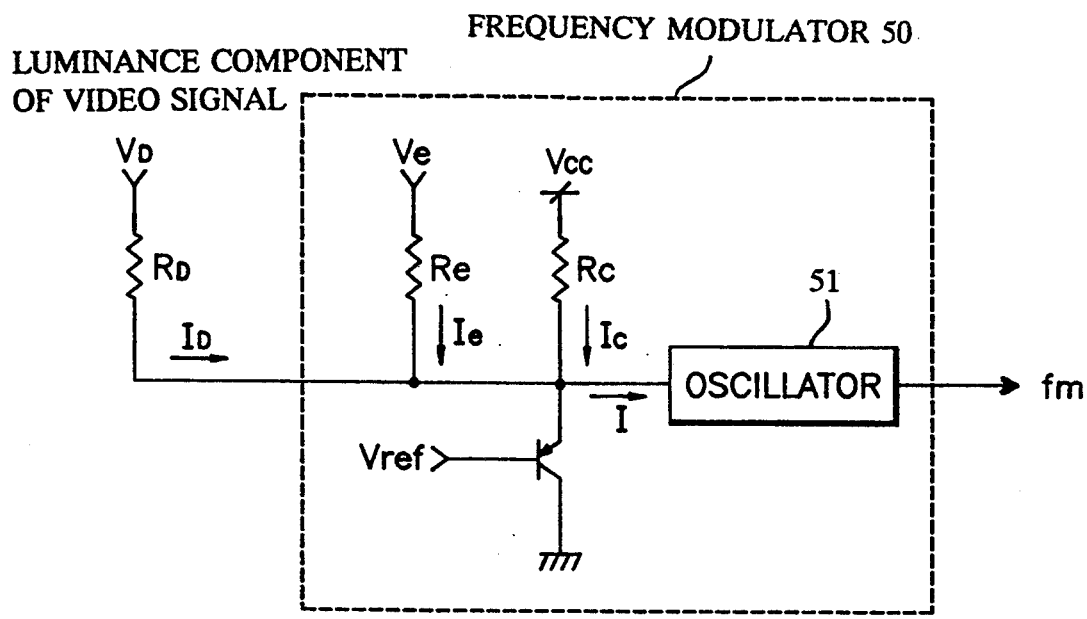
FIG. 3 is a circuit diagram showing automatic controlling of a frequency modulator with regard to current.

Referring to FIG. 3, since the frequency modulator 50 is made to have the same structure as the voltage controlled oscillator 30, the frequency modulator 50 oscillates at 3.4 MHZ when the current I=Ic+Ie. Namely, $$f_m = f_{3.4MHZ} = \frac{I}{4 \cdot C \cdot V} = \frac{I_c + I_e}{4 \cdot C \cdot V}.$$

In this case, the current I=Ic+Ie is the current applied to the oscillator 51.

Figure 4:
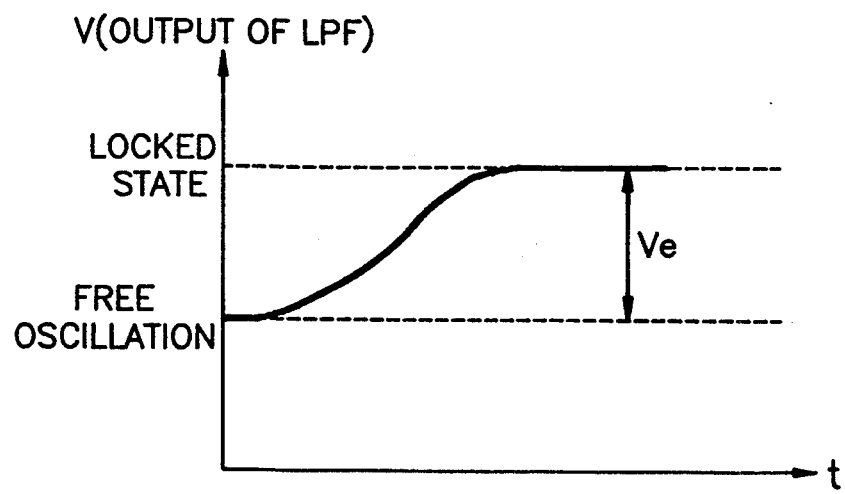
FIG. 4 is a graph showing changes of an output error voltage of an integrating circuit of a phase locked loop.

In FIG. 4, the value Ve is used to automatically control the carrier frequency $f_m$ of the frequency modulator. In addition, the luminance signals are applied to an input terminal $V_D$, as shown in FIG. 3, to produce the current $I_D$ through the resistor $R_D$ for changes of a signal level, where the current $I_D$ changes an oscillation frequency of the oscillator 51.

The total current I applied to the oscillator 51 is I=Ic+Ie+$I_D$, wherein Ic+Ie is the current to fix the carrier frequency $f_m$, and $I_D$ is the current change with the variation of the luminance signal level. In this case, a slope of a modulation characteristic curve $\Delta F/\Delta I$ may be determined by adjusting a value of the resistor $R_D$. Thus the error voltage $V_e$ generated from the phase locked loop 40 is applied to the frequency modulator of the same structure as the voltage controlled oscillator 30 to automatically establish the carrier frequency $f_m$ when the reference frequency is 3.4 MHZ, while applying the luminance signals to the input terminal $V_D$ of the frequency modulator 50 thus obtaining the desired modulated frequency $f_m$.

As stated above, when the voltage level change of the video luminance signals applied to the frequency modulator 50 is converted into the current $\Delta I$ to produce the oscillation frequency $f_s$ for the current level 1, the error voltage $V_e$ generated from the phase locked loop 40 is applied to the frequency modulator 50 in order to correctly generate the carrier frequency $f_m$ for the sync tip level of the luminance signals. Thus the change of the characteristics of each element proceeds in the same direction to secure the stability of the modulation characteristics of the frequency modulator 50 due to the same structure and characteristics of the voltage controlled oscillator 30 and frequency modulator 50 of the phase locked loop 40. Moreover the possible characteristic changes caused by environmental factors such as temperature may be compensated by a feedback loop via the phase locked loop 40, to obtain the carrier frequency $f_m$ constant for the external environment.

While the invention has been particularly shown and described with reference to one preferred specific embodiment, it will be apparent to those who are skilled in the art that in the foregoing, changes in form and detail may be made without departing from the spirit and scope of the present invention.

What is claimed is:

1. A frequency control circuit for automatically controlling a carrier frequency of a video tape recorder, said frequency control circuit comprising:
   voltage controlled oscillator means for generating, in response to an error voltage, an output signal having a controlled frequency equal to a reference frequency;
   phase detector means for generating an error signal representing a phase difference between said output signal of said voltage controlled oscillator means and a given reference signal having said reference frequency;
   means for converting said error signal into said error voltage; and
   frequency modulator means for generating a frequency modulation signal by controlling generation of said carrier frequency in response to said error voltage and varying said carrier frequency in accordance with variations of a voltage level of a luminance component of a video signal.

2. The frequency control circuit as claimed in claim 1, wherein said frequency modulator means generates said carrier frequency corresponding to a sync tip level of said luminance component, in response to said error voltage.

3. The frequency control circuit of claim 1, wherein said frequency modulator means comprises:
   a first resistor for converting a voltage from a voltage source to a first current;
   a second resistor for converting said error voltage into a second current;
   a third resistor for converting said luminance signal into a third current; and
   an oscillator for controlling generation of said carrier frequency in dependence upon said first and second currents and for generating said frequency modulation signal by varying said carrier frequency in accordance with variation of said voltage level of said luminance component of said video signal.

4. The frequency control circuit as claimed in claim 1, wherein said frequency modulator means and said voltage controlled oscillator means have the same structure and output characteristics.

5. A frequency control circuit for automatically controlling a carrier frequency of a recording device, said frequency control circuit comprising:
   phase locked loop means for generating an error voltage in response to a predetermined reference signal having a reference frequency, said phase locked loop means comprising:
      voltage controlled oscillator means for generating, in response to said error voltage, an output signal having a controlled frequency equal to said reference frequency;
      phase detector means for generating an error signal representing a phase difference between the output signal of said voltage controlled oscillator means and said predetermined reference signal; and
      means for converting said error signal into said error voltage; and
   frequency modulator means for generating a frequency modulation signal by controlling generation of said carrier frequency in response to said error voltage and varying said carrier frequency in accordance with variations of a voltage level of a luminance component of a video signal.

6. The frequency control circuit of claim 5, wherein said frequency modulator means generates, in response to said error voltage, said carrier frequency corresponding to a sync tip level of said luminance component.

7. A frequency control circuit for automatically controlling a carrier frequency of a recording device, said frequency control circuit comprising:
   means for generating an error voltage in response to a predetermined reference signal having a reference frequency, said error voltage generating means comprising:
      voltage controlled oscillator means for generating, in response to said error voltage, an output signal having a controlled frequency equal to said reference frequency;
      phase detector means for generating an error signal representing a phase difference between the output signal of said voltage controlled oscillator means and said predetermined reference signal; and
      converting means for converting said error signal into said error voltage;
   and
   frequency modulator means for generating a frequency modulation signal by controlling generation of said carrier frequency in response to said error voltage and varying said carrier frequency in accordance with variations of a voltage level of a luminance component of a video signal.

8. The frequency control circuit of claim 7, wherein said frequency modulator means generates, in response to said error voltage, said carrier signal having said carrier frequency corresponding to a sync tip level of said luminance component.

9. A method for automatically controlling a carrier frequency of a recording device, said method comprising the steps of:
   generating an output signal having a controlled frequency equal to a reference frequency, response to an error voltage;

generating an error signal representing a phase difference between said output signal and a given reference signal having said reference frequency;

converting said error signal into said error voltage; and generating a frequency modulation signal by controlling generation of said carrier frequency in response to said error voltage and varying said carrier frequency in accordance with variations of a voltage level of a luminance component of a video signal.

10. A frequency control circuit for controlling a carrier frequency of a carrier signal in a video recording device, comprising:

first means for generating an error voltage corresponding to a reference frequency of a reference signal; and second means for generating said carrier signal having said carrier frequency in dependence upon the magnitude of said error voltage, and for frequency modulating said carrier signal, in response to a luminance signal of a video signal, to generate a frequency modulation signal, said second means comprising:

means for controlling said carrier frequency of said carrier signal in response to said error voltage by generating a first control signal;

means for controlling frequency of said carrier signal in response to said luminance signal by generating a second control signal; and oscillator means for generating said frequency modulation signal, in response to a third control signal formed by said first control signal added to said second control signal.

11. The frequency control circuit as claimed in claim 10, wherein said means for generating an error voltage comprises:

voltage controlled oscillation means for generating a control frequency signal having a frequency substantially the same as said reference frequency of said reference signal, in response to said error voltage;

phase detection means for comparing a phase difference between said control frequency signal and said reference signal to generate an error signal; and means for converting said error signal to said error voltage.

12. The frequency control circuit as claimed in claim 11, wherein said means for converting said error voltage and said voltage controlled oscillation means have the same structure and output characteristics.

13. The frequency control circuit as claimed in claim 10, wherein a sync tip level of said luminance signal is modulated with said carrier frequency.

14. A frequency control circuit for controlling a carrier frequency of a frequency modulation signal for a video recording device, comprising:

first means for generating an error voltage corresponding to a reference frequency of a reference signal; and second means for generating a carrier signal having said carrier frequency in dependence upon the magnitude of said error voltage, and for frequency modulating said carrier signal, in response to a luminance signal of a video signal, to generate a frequency modulation signal, said second means comprising:

a first resistor interposed between a voltage source and a node, for converting a voltage of said voltage source to a first current;

a second resistor interposed between a first input terminal and said node, for receiving said error voltage and converting said error voltage into a second current;

a third resistor interposed between a second input terminal and said node, for receiving said luminance signal and converting said luminance signal into a third current; and an oscillator for generating said frequency modulation signal in dependence upon said first, second and third currents.

15. The frequency control circuit as claimed in claim 14, wherein said means for generating an error voltage comprises:

voltage controlled oscillation means for generating a control frequency signal having a frequency substantially the same as said reference frequency of said reference signal, in response to said error voltage;

phase detection means for comparing a phase difference between said control frequency signal and said reference signal to generate an error signal; and means for converting said error signal to said error voltage.

16. The frequency control circuit as claimed in claim 15, wherein said means for converting said error voltage and said voltage controlled oscillation means have the same structure and output characteristics.

17. The frequency control circuit as claimed in claim 14, wherein a sync tip level of said luminance signal is modulated with said carrier frequency.

18. The frequency control circuit as claimed in claim 17, wherein said carrier frequency is approximately 3.4 1 megahertz.

19. A method of modulating a carrier signal having a carrier frequency, in a video recording device, said method comprising:

generating an error voltage corresponding to a reference frequency of a reference signal;

converting said error voltage to a first current indicative of said carrier frequency of said carrier signal;

converting a luminance signal of a video signal to a second current; and generating a frequency modulated signal in dependence upon said first and second currents.

20. The method as claimed in claim 19, wherein said step of generating an error voltage comprises:

generating a control signal having a control frequency in response to said error voltage;

comparing said reference frequency to said control frequency of said control signal, to generate an error signal; and integrating said error signal to generate said error voltage.

* * * * *

UNITED STATES PATENT AND TRADEMARK OFFICE
CERTIFICATE OF CORRECTION

PATENT NO. : 5,347,240
DATED : September 13, 1994
INVENTOR(S) : Eui-Keun Park

It is certified that error appears in the above-indentified patent and that said Letters Patent is hereby corrected as shown below:

Column 1,

Line 43    Change "auideo" to —a video—;

IN THE CLAIMS

Column 4

Line 67    Before "response" insert —in—;

Column 6

Line 43    Before "megahertz" delete "1":

Signed and Sealed this

First Day of October, 1996

Attest:

BRUCE LEHMAN

Attesting Officer    Commissioner of Patents and Trademarks